Inventor:
Walter Garwacki,
by John F. Ahern
His Attorney.

United States Patent Office 3,479,573

Patented Nov. 18, 1969

3,479,573

WIDE BAND GAP SEMICONDUCTOR DEVICES HAVING IMPROVED TEMPERATURE INDEPENDENT NON-RECTIFYING CONTACTS

Walter Garwacki, Schenectady, N.Y., assignor to General Electric Company, a corporation of New York Filed Feb. 15, 1967, Ser. No. 616,366
Int. Cl. H01l 3/00, 5/00, 11/00
U.S. Cl. 317—237 6 Claims

ABSTRACT OF THE DISCLOSURE

Improved semiconductor bodies useful as light emitting diodes and solar cells include a body of P-type compound semiconductor of the II–VI class such as zinc telluride and an ohmic or non-rectifying contact made to one surface of the body. The contact includes a first region containing an alkali metal such as lithium surface diffused therein, a second region overlapping the first region and comprising chemically reacted gold at the surface of the wafer, and a wetted contact to first and second regions and to the overlapped region made by an alloy of a conductive metal having non-rectifying or P-conductivity type characteristics as for example, an alloy of indium and silver. The semiconductor body may be entirely P-type or may contain a P-N junction.

Figure 1:
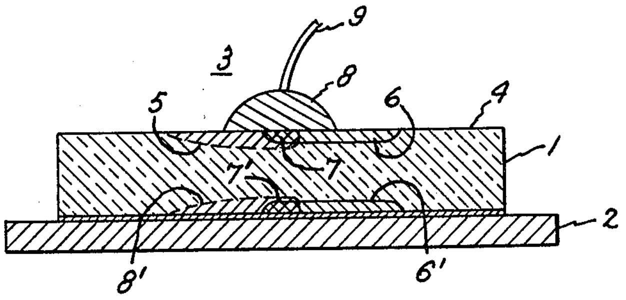

The present invention relates to wide band gap semiconductor devices, and more particularly to such devices having contacts thereto having improved non-rectifying characteristics capable of maintaining their non-rectifying characteristic over a wide range of temperatures as low as 20° K. for example, and up to and above 373° K., and to methods for making such devices.

Wide band gap semiconductor devices utilizing zinc or cadmium as a cation and tellurium or a complex material consisting of tellurium and selenium as a cation have great utility in the production of solar cells and light emitting members as well as other solid state signal transmitting devices.

Several such uses are set forth for materials of the zinc-seleno-telluride family of wide band gaps semiconductors, having a band gap at several ev. as compared to near 1 volt for germanium and silicon, as are set forth in the abandoned copending application of Aven and Garwacki, Ser. No. 537,514, filed Mar. 25, 1966, and the abandoned application of Manuel Aven, Ser. No. 537,519, also filed Mar. 25, 1966, both of which are assigned to the present assignee, the disclosures of which are incorporated herein by reference. In wide band gap semiconductor devices having P-type conductivity, it is difficult to provide a suitable contact structure for the maintainence of substantially ohmic or non-rectifying conductive characteristics over a wide range of temperatures, particularly at low temperatures below approximately 150° K. The best known prior art contact material is gold and this begins to fail at approximately 140° K. Such problems with N-type contacts, which are generally easily kept substantially ohmic over a wide range of temperatures, are not nearly as severe.

Accordingly, it is an object of the present invention to provide wide band gap P-type semiconductive devices having improved non-rectifying contacts at a wide range of temperatures.

Yet another object of the present invention is to provide improved wide band gaps semiconductors including at least a P-type region to which a substantially ohmic or non-rectifying contact is capable of maintaining its non-rectifying characteristics at exceedingly low temperatures.

Yet another object of the present invention is to provide an improved method for forming improved non-rectifying contacts to wide band gap P-type semiconductor bodies.

Briefly stated, in accord with one aspect of my invention I provide a semiconductor device having at least a portion of which is comprised of a monocrystalline body of a wide band gap semiconductor of the II–VI compound type semiconductors having P-type characteristics and a substantially ohmic or non-rectifying contact thereto comprising a first surface adjacent region that is alkali-metal diffused, a second surface adjacent region overlapping said first adjacent region that is chemically reacted with gold and a good conducting metal overlying both first and second surface regions and the overlapped region and comprising a suitable metal to which an electrode contact may be attached.

Figure 2:
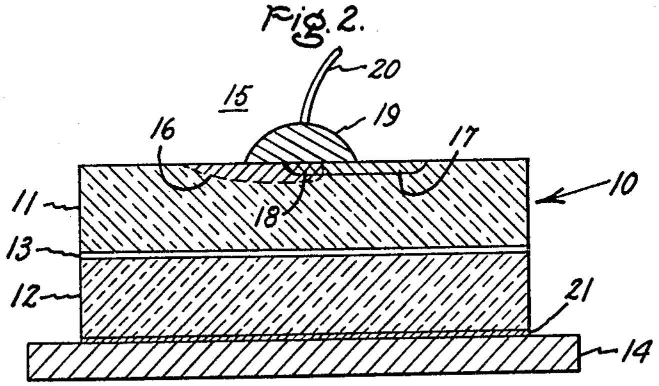

The novel features believed characteristics of the present invention are set forth in the appended claims. The invention itself, together with further objects and advantages thereof, may best be understood by reference to the following description taken in connection with the appended drawing in which:

FIGURE 1 illustrates in vertical cross-section, a semiconductive body utilizing a P-type body of wide band gap semiconductive material having a non-rectifying contact thereto that maintains its non-rectifying characteristics over a wide range of temperatures, and FIGURE 2 is a vertical cross-sectional view of a wide band gap semiconductive body having a P-N junction therein and including a region of P-type conductivity characteristic having a non-rectifying contact thereto that maintains its non-rectifying characteristic over a wide range of temperatures.

In FIGURE 1 of the drawing a semiconductor device in accord with the invention includes a monocrystalline ingot 1 of a wide band gap semiconductive material having P-type conductivity characteristics mounted in conductive electrical contact upon a suitable metallic substrate 2 and having a non-rectifying contact assembly represented generally as 3 made to the exposed major surface portion 4 thereof.

Monocrystalline wafer of P-type semiconductor 1 may have as the cation thereof zinc or cadmium or a complex cation thereof wherein zinc and cadmium may be combined in any proportions from 0 to 100% of either. The anion of the wide band semiconductor of body 1 may be comprised of tellurium or a telluride selenide wherein the anion is represented by the formula $$M \cdot Te_xSe_{(1-x)}$$

where $x$ is a number from 0.2 to 1, and M is zinc or cadmium or a mixture thereof.

Metallic substrate 2 may be any metal which makes conductive electrical contacts to P-type wide band semiconductors of the II–VI type semiconductive bodies and may conveniently be lead, tin, silver, gold, or a suitable material having small amounts of alloying constituents as for example, a few percent of copper, silver, phosphorus, arsenic, antimony, or bismuth in a conductive material such as lead, tin, or indium.

Non-rectifying contact 3 is comprised of three distinct surface-adjacent regions, an alkali metal diffused surface adjacent region 5, a chemically reacted gold containing region 6, and a region 7 containing both the alkali diffused metal and the chemically reacted gold. A contact making solder member 8 composed of a good electrically conductive metallic material such as any of those materials set forth as suitable for substrate 2 is suitably attached to regions 5, 6, and 7. In operation, the gold operates as a source of deep-lying acceptor levels of approximately 0.25 electron volt within the forbidden band which are ideally suited for maintaining substantially ohmic, non-rectifying contacts with P-type, wide band gap semiconductors of the II–VI class at high temperatures. It has been found, however, that with decreasing temperature these deep-lying acceptor levels tend to "freeze out" at temperatures of approximately 140° K. to 150° K., thus losing the non-rectifying characteristic of the contact, which becomes more and more rectifying and less and less ohmic in its characteristic. A gold contact alone is substantially a rectifying contact to a P-type wide band gap II–VI semiconductive compound at the temperature of 77° K., the temperature of liquid nitrogen.

At low temperatures, the conductive characteristics of the alkali metals lithium, sodium, potassium and rubidium tend to induce shallow acceptor levels within the forbidden band and lithium, that material which constitutes the preferred alkali metal for use in contacts in accord with the present invention is known to possess the characteristic of high solubility in the II–VI compound semiconductors, in addition to a rapid diffusion characteristic, ideal for making low temperature surface diffused regions. The shallow levels induced by the alkali metals in accord with the invention do not "freeze out" at low temperatures and are effective to maintain substantially ohmic non-rectifying contact between a solder member 8 of contact 3 and semiconductor body 1 at temperatures even as low as 26° K. and lower. As will be more fully described hereinafter, in order that there be complete continuity in the region of transition from the reliance upon the substantially ohmic non-rectifying characteristics of each of the regions 5 and 6 of acceptor assembly 3 with increasing or decreasing temperature the regions are made to overlap so that within region 7 there is both alkali metal and gold in the surface adjacent region of the semiconductive material. A similar contact assembly comprised of portions 6′, 7′ and 8′ make non-rectifying contact to the opposite face of wafer 1 and is connected to substrate 2, which may be a good thermal conductor such as copper by a thin layer of 3% sliver indium solder, for example.

A device in accord with FIGURE 1 of the drawing may conveniently be fabricated as follows. A monocrystalline wafer of zinc-telluride having P-type conductivity characteristics and a room temperature resistivity of approximately 50 ohms centimeters and a resistivity at 40° K. of approximately 50,000 ohms cm. and having dimensions of approximately 6 millimeters by 2 millimeters by 2 millimeters is etched in boiling sodium hydroxide for approximately 4 to 5 seconds and washed in distilled water. The wafer is placed upon a flat heater surface maintained at a temperature of approximately 40° C. in air. A drop of a solution of lithium nitrate having a concentration of $10^{-4}$ mols per milliter is deposited upon the surface 4 of the zinc telluride wafer and allowed to dry, leaving a crystallized salt upon the surface. The wafer is then enclosed in a bell jar upon the surface and an atmosphere of hydrogen is admitted to the bell jar. The temperature of the wafer is raised over a period of from ten to fifteen seconds to approximately 350° C. and held for approximately 1 minute at this temperature. At this temperature the crystallized lithium nitrate melts and spreads over the surface of the wafer to a diameter of approximately 1 millimeter in circular cross-section and penetrates into the surface of the crystal. It is believed that during this process the lithium is diffused into the crystal and the remainder of the salt is taken into the atmosphere. The wafer is allowed to cool and is rinsed in distilled water and dried. A drop of a solution of auric acid ($HAuCl_4 \cdot 3H_2O$) of a strength of approximately 0.0125 mol per milliliter in water solution is deposited so as to approximately overlap one-half of the surface treated lithium region of surface 4 of zinc-telluride wafer 1. The auric acid solution placed upon the surface at room temperature immediately reacts with the surface, forming a surface-adjacent region containing gold and an exposed layer of gold at the top thereof. The wafer is allowed to sit for approximately two minutes to allow the reaction to go to completion, after which time the bell jar is placed over the wafer and an atmosphere of dry hydrogen is admitted thereto. The wafer is heated to approximately 100° C. and held at that temperature for approximately 30 seconds, after which the bell jar is removed and the wafer allowed to cool. A small quantity, weighing approximately 5 milligrams, of a suitable solder, conveniently an indium-silver solder containing three weight percent of silver, is mechanically pressed into intimate contact with the surface treated regions 5, 6, and 7. An electrical contact wire 8 may conveniently be soldered by conventional techniques thereto to form the contact.

When the contact is formed, as above, it is found to be substantially ohmic and non-rectifying in characteristic from temperatures of 26° K. to 373° K. without any substantial variation. The process is repeated to form the contact to the opposite side of the wafer and the silver-indium solder is used to fasten the wafer to a copper block 1 cm. square in hydrogen at 100° C.

As is mentioned hereinbefore, lithium is the preferred embodiment of the metallic shallow level inducing metal that is diffused into region 5. It is, however, appropriate that the alkali metals sodium, potassium and rubidium may be used as well. In practicing the process for forming the contact described hereinbefore, the nitrate is only a convenient salt which may be used and suitable other salts which do not adversely effect the telluride may be used. For example the alkali metal salts of chloride, bromine, iodine, sulfur and selenium may be used to advantage. Similarly, the heating temperatures and times are not critical, but require only that the heat be moderate enough so that the material used is not rapidly dissociated or boiled away, and only that the temperatures be sufficiently hot enough to cause the required fusion of the salt and the diffusion of the metal of the salt into the surface. The auric acid solution concentration is not critical.

In FIGURE 2 of the drawing another embodiment of the invention is illustrated in vertical cross-section. In FIGURE 2 a monocrystalline body of zinc-seleno-telluride 10 represented by the formula $ZnSe_xTe_{1-x}$ where $x$ may be any number from 0.2 to 0.6. Wafer 10 includes a first P-type region 11 and a second N-type region 12 separated by a P-N junction 13. Wafer 10 is mounted upon a good electrically conducting metallic substrate 14 which is in good electrical contact with N-type region 12 and an acceptor contact assembly represented generally at 15 is in non-rectifying contact with P-type region 11. Non-rectifying contact assembly 15 comprises a first surface adjacent region 16 containing alkali metal diffused shallow acceptor inducing atoms, a chemically reacted gold-plated region 17 containing deep-lying acceptor level inducing gold atoms and an intermediate region 18 containing the materials of both regions 16 and 17. A solder contact 19 is in intimate mechanical and electrical contact with regions 16, 17, and 18, and an electrical contact 20 is made to solder member 19.

The materials of wafer 10 are zinc-seleno-telluride having the formula $ZnSe_xTe_{1-x}$ wherein $x$ has a value of from 0.2 to 0.6. Region 11 has a quantity of approximately $10^{17}$ atoms per cc. of acceptor inducing impurities therein which may be from the group consisting of zinc vacancies, copper, silver, phosphor, arsenic, antimony, or bismuth. Region 12 is the same zinc-seleno-telluride having a quantity of shallow donor inducing impurities contained therein of approximately $10^{17}$ atoms per cc. and may conveniently be selected from the group consisting of gallium, indium, aluminum, chlorine, bromine, and iodine. P-N junction 13 is formed by the diffusion of the opposite conductivity inducing type impurities into the zinc-seleno-telluride wafer and exhibits non-rectifying characteristics and has the characteristic of emitting high intensity injection electroluminescent light out-put when a unidirectional voltage of proper magnitude is applied between members 14 and 20. Contact is made between a copper substrate and N-type region 12 of wafer 10 by means of a thin layer 21 of approximately 5% mercury amalgam with indium, thus connecting the device to a thermal sink for heating or cooling.

Due to the low power dissipation of the acceptor contacts made to devices in accord with the present invention, a power efficiency can be achieved which has been heretofore unobtainable. The intensity of the radiation due to injection electroluminescence from P-N junction 13 of the device of FIGURE 2 makes possible the achievement of the emission of stimulated coherent optical radiation from junction 13 with the appropriate application of a sufficiently high electrical input between members 20 and 14. This may conveniently be achieved by utilizing the resonant structure and polished and reflecting edge faces substantially as disclosed in Hall Patent No. 3,245,-002, issued Apr. 5, 1966. Such emission would be at a wavelength of 6200 A.U.

While the invention has been described hereinbefore with respect to certain embodiments and features thereof, many modifications and changes will readily occur to those skilled in the art. Accordingly, it is intended by the appended claims to cover all such modifications and changes as fall within the true spirit and scope of the invention.

What I claim as new and desire to secure by Letters Patent of the United States is:

1. A wide band gap semiconductor device comprising:

(a) a monocrystalline body of a wide band gap semiconductor material of the II–VI class including a region thereof having P-type electrical conduction characteristics and (b) a non-rectifying contact to one surface portion of said body including (b1) a first surface-adjacent region of said body containing diffused atoms of a shallow level-inducing alkali metal (b2) a second surface-adjacent region of said body overlapping said first surface-adjacent region and containing chemically reacted gold atoms therein and a surface of metallic gold thereover, (b3) a third region defined by the overlapping of said first and said second surface-adjacent regions and including both diffused alkali metal atoms and chemically reacted gold atoms, and (b4) a conductive metal overlying at least a portion of said first, second, and third surface-adjacent regions and making good electrical contact therewith.

2. The device of claim 1 wherein the semiconductor is composed of a cation selected from the group consisting of cadmium, zinc and mixtures thereof and the anion thereof selected from the group consisting of tellurium, and a mixture of tellurium and selenium.

3. The device of claim 1 wherein the alkali metal is selected from the group consisting of lithium, sodium, potassium and rubidium.

4. The device of claim 3 wherein the alkali metal is lithium.

5. The device of claim 1 wherein the semiconductor body is homogeneous and has at least two such non-rectifying contacts to different surface portions thereof.

6. The device of claim 1 wherein the wafer is comprised of regions of opposite conductivity type separated by a light emitting P-N junction.

References Cited

UNITED STATES PATENTS 2,956,216 10/1960 Jenny et al. ---------- 317—235
3,012,175 12/1961 Jones et al. ---------- 317—237

OTHER REFERENCES

Rupprecht et al., "Low Resistivity . . ." in IBM Technical Disclosure Bulletin, vol. 8, No. 4, September 1965, p. 475.

JAMES D. KALLAM, Primary Examiner

SIMON BRODER, Assistant Examiner

U.S. Cl. X.R.

317—234, 235